(12) United States Patent
Bae

(10) Patent No.: US 7,843,743 B2
(45) Date of Patent: Nov. 30, 2010

(54) DATA OUTPUT CIRCUIT FOR SEMICONDUCTOR MEMORY APPARATUS

(75) Inventor: Ji-Hyae Bae, Ichon (KR)

(73) Assignee: Hynix Semiconductor Inc. (KR)

( * ) Notice: Subject to any disclaimer, the term of this patent is extended or adjusted under 35 U.S.C. 154(b) by 235 days.

(21) Appl. No.: 12/047,793

(22) Filed: Mar. 13, 2008

(65) Prior Publication Data

US 2008/0253203 A1   Oct. 16, 2008

(30) Foreign Application Priority Data

Apr. 13, 2007   (KR) .............. 10-2007-0036331

(51) Int. Cl.
*G11C 7/00* (2006.01)

(52) U.S. Cl. .............. 365/189.15; 365/219; 365/191; 365/233.1; 365/189.12

(58) Field of Classification Search .............. 365/219, 365/189.15, 191, 233.1, 189.12
See application file for complete search history.

(56) References Cited

U.S. PATENT DOCUMENTS

| | | | |
|---|---|---|---|
| 6,573,771 B2 | 6/2003 | Lee et al. | |
| 6,982,924 B2 * | 1/2006 | Na | 365/154 |
| 7,616,034 B2 * | 11/2009 | Lee | 327/144 |
| 2008/0080267 A1 * | 4/2008 | Lee | 365/191 |

FOREIGN PATENT DOCUMENTS

| | | |
|---|---|---|
| JP | 08-195672 | 7/1996 |
| JP | 2004-220602 | 8/2004 |
| JP | 2005-316722 | 11/2005 |
| JP | 2006-060842 | 3/2006 |
| JP | 2007-087468 | 4/2007 |

* cited by examiner

*Primary Examiner*—Tuan T Nguyen
*Assistant Examiner*—Toan Le
(74) *Attorney, Agent, or Firm*—Baker & McKenzie LLP

(57) ABSTRACT

A data output circuit for a semiconductor memory apparatus includes a data output control unit that generates a selection signal, an output timing signal, and an input control signal in response to a read command and a clock, and a signal-responsive data output unit that receives parallel data in response to the input control signal, arranges the parallel data in response to the selection signal, and sequentially outputs the arranged parallel data as serial data in synchronization with the output timing signal.

24 Claims, 11 Drawing Sheets

DATA OUTPUT CIRCUIT FOR SEMICONDUCTOR MEMORY APPARATUS

CROSS-REFERENCE TO RELATED PATENT APPLICATION

This application claims priority under 35 U.S.C. 119(a) to Korean Patent Application No. 10-2007-0036331, filed on Apr. 13, 2007, in the Korean Intellectual Property Office, the content of which is incorporated herein in its entirety by reference as if set forth in full.

BACKGROUND

1. Technical Field

The embodiments described herein relate to a semiconductor memory apparatus, and in particular, to a data output circuit that outputs data stored in a semiconductor memory apparatus.

2. Related Art

A conventional semiconductor memory apparatus receives serial data, converts the serial data into parallel data therein, and stores the converted parallel data. In addition, a conventional semiconductor memory apparatus converts the stored parallel data into serial data and outputs the converted serial data.

Accordingly, a conventional semiconductor memory apparatus includes a data output circuit that sequentially outputs the stored parallel data as the serial data.

FIG. 1 is a block diagram showing a general data output circuit for a conventional semiconductor memory apparatus.

If a read command "read_command" is input, the general data output circuit for a semiconductor memory apparatus generates output control signals "rpoutb<0:3>," "fpoutb<0:3>," and "poutb," and converts parallel data "data_p<0:7>" into serial data "data_s<0:7>" in response to the output control signals "rpoutb<0:3>," fpoutb<0:3>, and poutb. The data output circuit outputs the serial data "data_s<0:7>" in synchronization with a rising clock "rclk" and a falling clock "fclk." At this time, the rising clock "rclk" has a high-level period at the rising edge of the external clock "clk," and the falling clock "fclk" has a high-level period at the falling edge of the external clock "clk."

The data output circuit includes a data bit selection control unit 10 and a clock-responsive data output unit 20.

If the read command "read_command" is input to the semiconductor memory apparatus, the data bit selection control unit 10 generates the output control signals "rpoutb<0:3>," "fpoutb<0:3>," and "poutb" in synchronization with the external clock "clk" (hereinafter, referred to as "clock").

The clock-responsive data output unit 20 outputs the parallel data "data_p<0:7>" as the serial data "data_s<0:7>" in response to the output control signals "rpoutb<0:3>," "fpoutb<0:3>," and "poutb," the rising clock "rclk," and the falling clock "fclk."

FIG. 2 is a timing chart of the general data output circuit for a semiconductor memory apparatus.

The general data output circuit receives the parallel data "data_p<0:7>" when the output control signal "poutb" is enabled at a low level.

The output sequence of the even-numbered data "data<0>," "data<2>," "data<4>," and "data<6>" in the input parallel data "data_p<0:7>" is determined on the basis of an enable sequence of the output control signals "rpoutb<0:3>." In addition, the output sequence of the odd-numbered data "data<1>," "data<3>," "data<5>," and "data<7>" in the parallel data "data_p<0:7>" is determined on the basis of an enable sequence of the output control signals "fpoutb<0:3>."

As a result, the general data output circuit for a semiconductor memory apparatus outputs the even-numbered data "data<0>," "data<2>," "data<4>," and "data<6>" during a period in which the low enable period of each of the output control signals "rpoutb<0:3>" and the high-level period of the rising clock "rclk" overlap each other. In addition, the data output circuit outputs the odd-numbered data "data<1>," "data<3>," "data<5>," and "data<7>" during a period in which the low enable period of each of the output control signals "fpoutb<0:3>" and the high-level period of the falling clock "fclk" overlap each other.

In the general data output circuit, in order to output the 8-bit parallel data "data_p<0:7>" stored in the semiconductor memory apparatus as the serial data "data_s<0:7>," it is necessary to receive 11 signals in total, that is, the 9 output control signals "rpoutb<0:3>," "fpoutb<0:3>," and "poutb," the rising clock "rclk," and the falling clock "fclk."

For this reason, in the known data output circuit, 11 signal lines are needed to output the data to the minimum. Due to a large number of signal lines, the area of the semiconductor memory apparatus is inevitably increased. When a skew occurs in the rising clock and the falling clock, the data may not be normally output.

SUMMARY

Apparatuses for outputting data from a semiconductor memory apparatus are disclosed.

In one aspect, a data output circuit for a semiconductor memory apparatus that can reduce the number of signals for data output, is disclosed.

In another aspect, a data output circuit for a semiconductor memory apparatus that can output data without using a rising clock and a falling clock, is disclosed.

In a another aspect, a data output circuit for a semiconductor memory apparatus includes a data output control unit that can be configured to generate a selection signal, an output timing signal, and an input control signal in response to a read command and a clock, and a signal-responsive data output unit that can be configured to receive parallel data in response to the input control signal, arrange the parallel data in response to the selection signal, and sequentially output the arranged parallel data as serial data in synchronization with the output timing signal, is disclosed.

These and other features, aspects, and embodiments are described below in the section entitled "Detailed Description."

DETAILED DESCRIPTION

A data output circuit can be configured to output stored parallel data "data_p<0:7>" as serial data "data_s<0:7>" when a predetermined time (CAS Latency) elapses after a read command "read_command" is input to a semiconductor memory apparatus. In this embodiment, the parallel data "data_p<0:7>" and the serial data "data_s<0:7>" can be implemented with 8-bit data. However, it should be understood that the parallel data and the serial data can also be implemented with multi-bit data other than 8-bit data.

Figure 1:
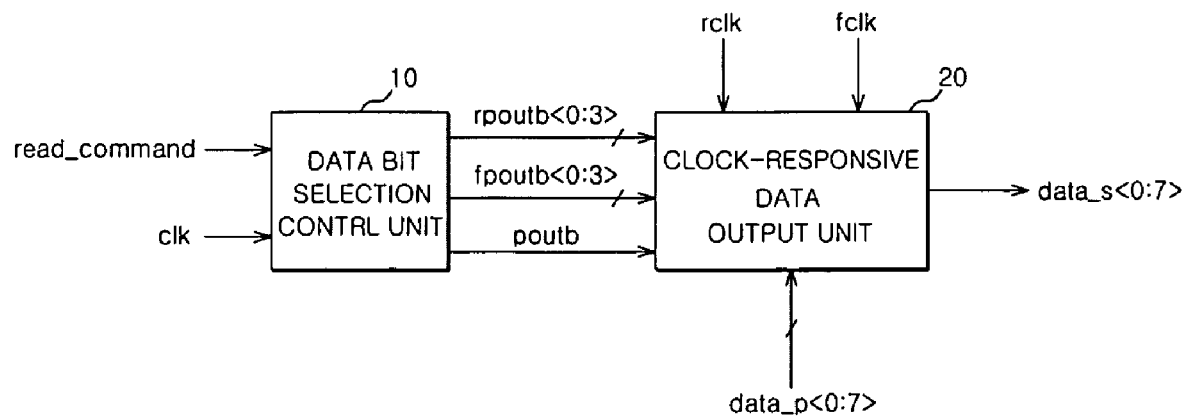
FIG. 1 is a block diagram showing an exemplary data output circuit for a semiconductor memory apparatus.
Figure 2:
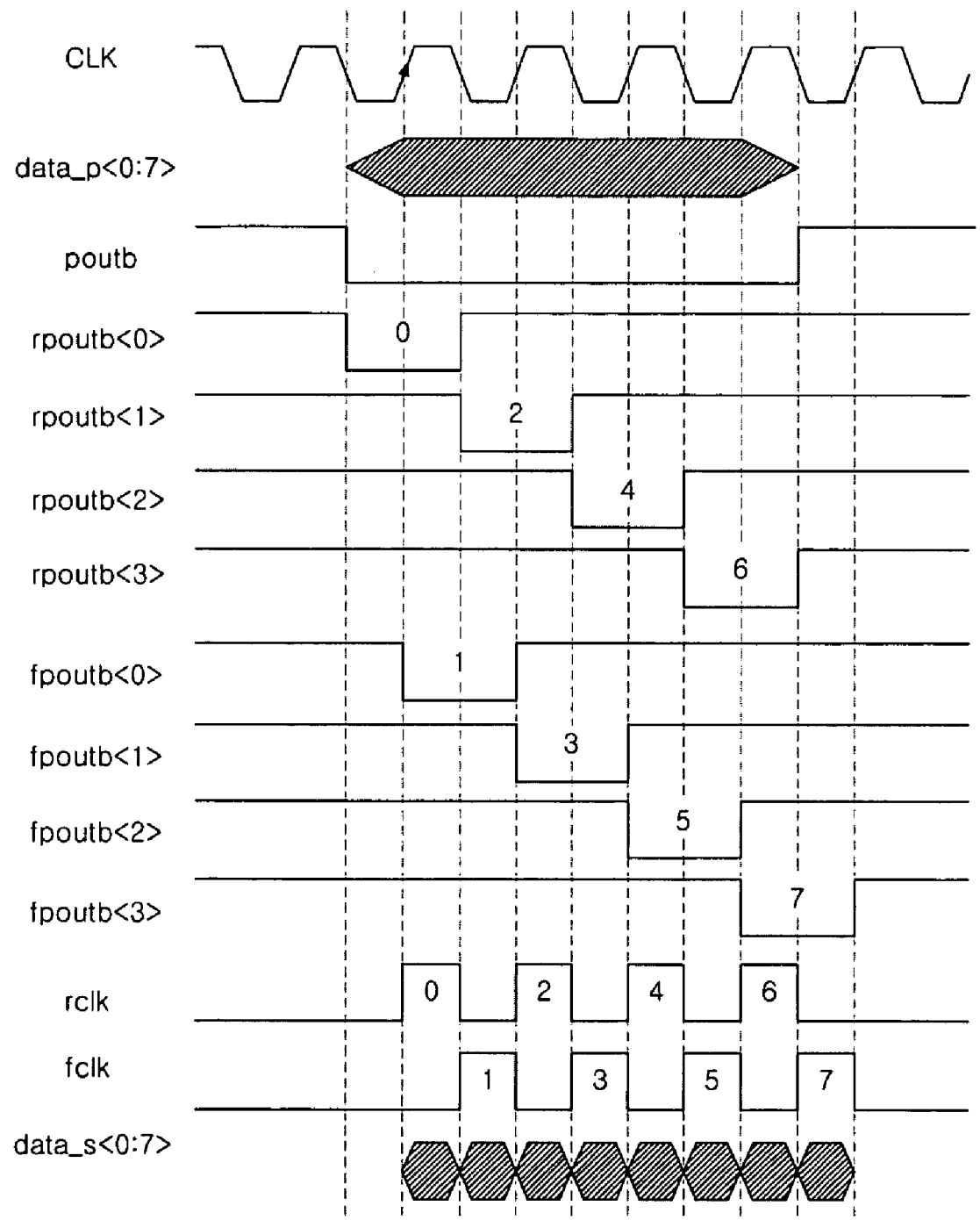
FIG. 2 is a timing chart of the data output circuit for a semiconductor memory apparatus of FIG. 1.
Figure 3:
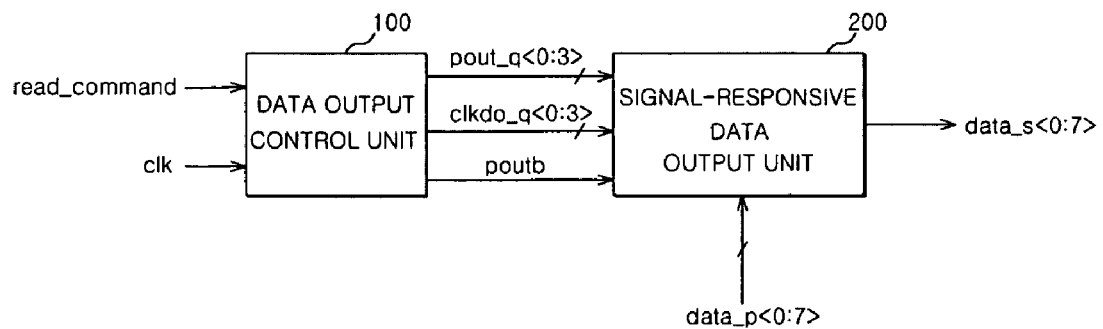
FIG. 3 is a block diagram showing a data output circuit for a semiconductor memory apparatus, in accordance with one embodiment.

As shown in FIG. 3, a data output circuit, in accordance with one embodiment, can include a data output control unit 100 and a signal-responsive data output unit 200.

The data output control unit 100 can be configured to generate output control signals "pout_q<0:3>," "clkdo_q<0:3>," and "poutb" in synchronization with an external clock "clk" (hereinafter, referred to as "clock") when the predetermined time elapses after the read command "read_command" is input to the semiconductor memory apparatus.

The signal-responsive data output unit 200 can be configured to sequentially output the parallel data "data_p<0:7>" as the serial data "data_s<0:7>" in response to the output control signals "pout_q<0:3>," "clkdo_q<0:3>," and "poutb."

Figure 4:
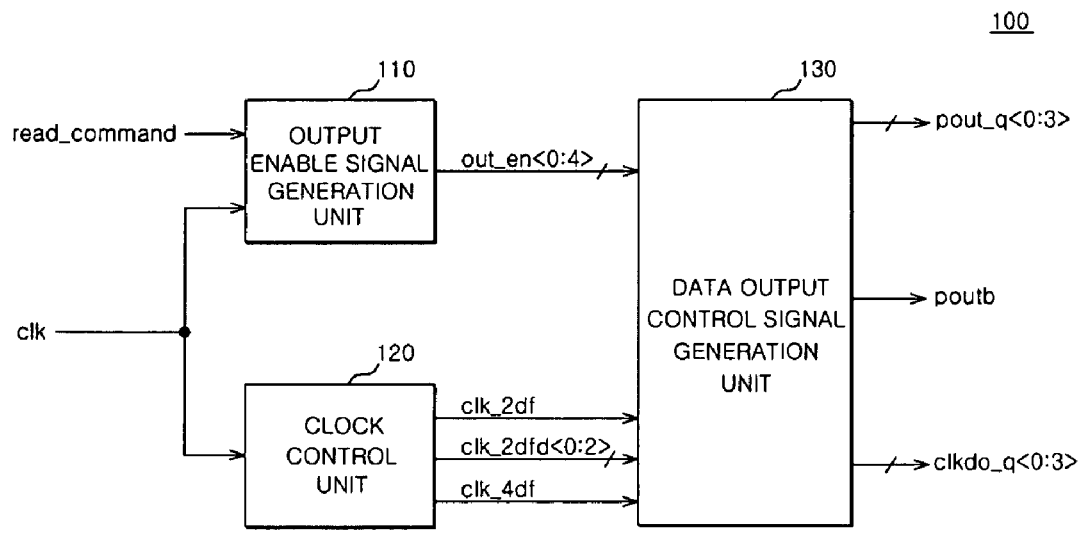
FIG. 4 is a block diagram showing a data output control unit that can be included in the apparatus shown in FIG. 3, in accordance with one embodiment.

As shown in FIG. 4, the data output control unit 100 can include an output enable signal generation unit 110, a clock control unit 120, and a data output control signal generation unit 130.

The output enable signal generation unit 110 can be configured to generate first to fifth output enable signals "out_en<0:4>" in synchronization with the clock "clk" when a predetermined time elapses after the read command "read_command" is input to the semiconductor memory apparatus.

The clock control unit 120 can be configured to divide the clock "clk" and generate a divided-by-two clock signal "clk_2df" and a divided-by-four clock signal "clk_4df." In addition, the clock control unit 120 can be configured to delay the divided-by-two clock signal "clk_2df" and generate first to third delayed divided-by-two clocks signal "clk_2dfd<0:2>."

The data output control signal generation unit 130 can be configured to generate first to fourth selection signals "pout_q<0:3>," an input control signal "poutb," and first to fourth output timing signals "clkdo_q<0:3>" in response to the first to fifth output enable signals "out_en<0:4>," the divided-by-two clock signal "clk_2df," the divided-by-four signal "clock clk_4df," and the first to third delayed divided-by-two clocks signal "clk_2dfd<0:2>."

Figure 5:
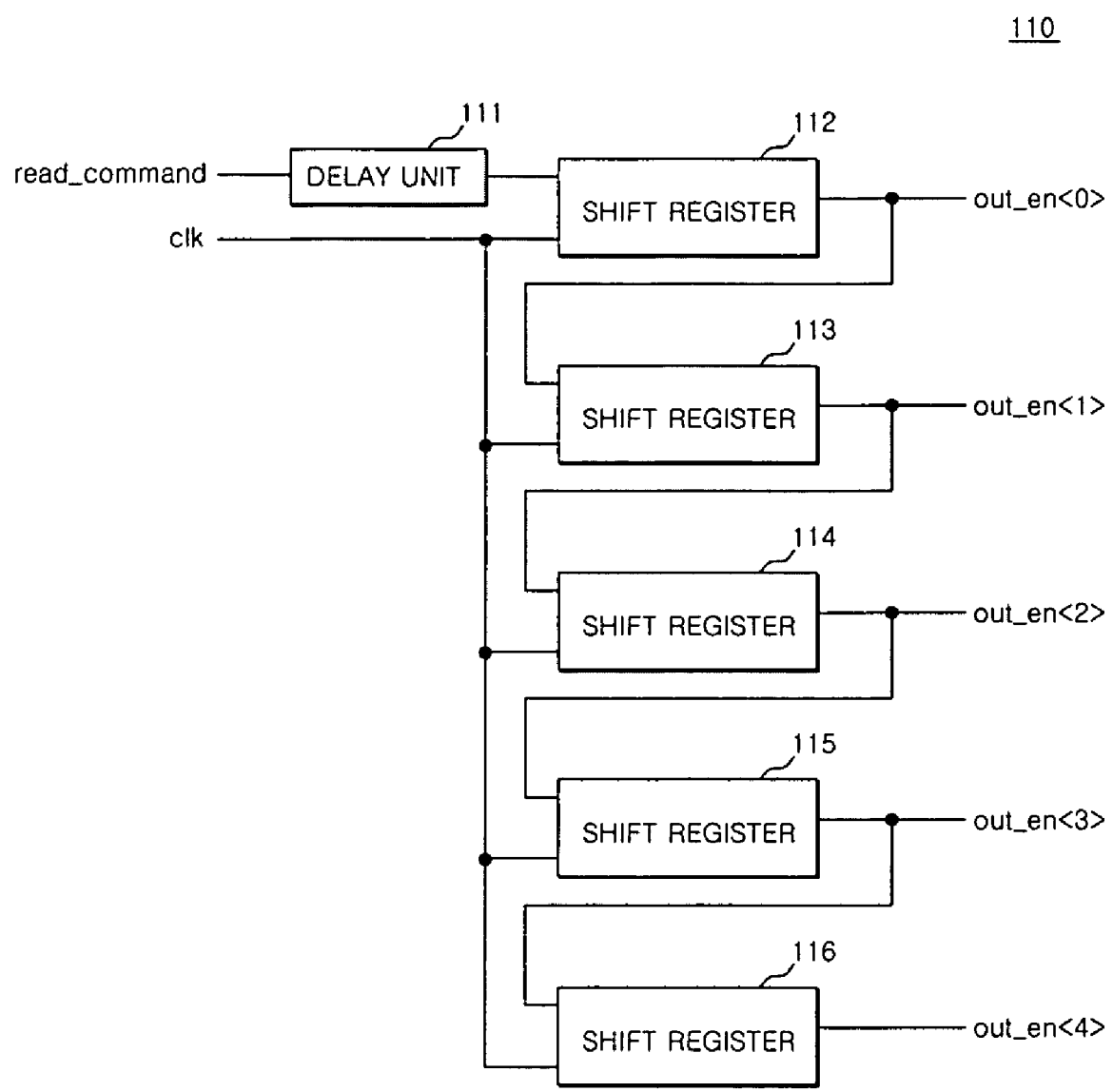
FIG. 5 is a circuit diagram showing an output enable signal generation unit that can be included in the data output control unit shown in FIG. 4, in accordance with one embodiment.

The output enable signal generation unit 110 shown in FIG. 5 can be configured to generate first to fifth output enable signals "out_en<0:4>" when a predetermined time elapses after the read command "read_command" is input to the semiconductor memory apparatus. Here, if an output enable signal "out_en<i>" that is first enabled and first changed to a high level, is disabled, a next output enable signal "out_en<j>" can be enabled at a high level. In addition, the enable period of each of the first to fifth output enable signals "out_en<0:4>" can be the same as one cycle of the clock signal "clk."

The output enable signal generation unit 110 can include a first delay unit 111, and first to fifth shift registers 112 to 116.

The first delay unit 111 can be configured to operate the first shift register 112 when the predetermined time elapses after the read command "read_command" is input.

The first to fifth shift registers 112 to 116 can receive the clock "clk." In addition, the first to fifth shift registers 112 to 116 can be connected in series. At this time, the first shift register 112 can be configured to output the first output enable signal "out_en<0>," the second shift register 113 can be configured to output the second output enable signal "out_en<1>," the third shift register 114 can be configured to output the third output enable signal "out_en<2>," the fourth shift register 115 can be configured to output the fourth output enable signal "out_en<3>," and the fifth shift register 116 can be configured to output the fifth output enable signal "out_en<4>."

Figure 6:
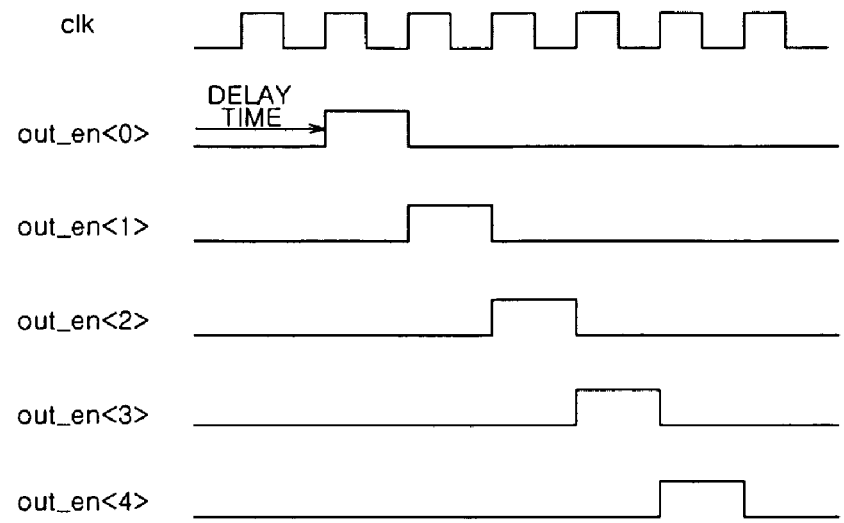
FIG. 6 is a timing chart of the output enable signal generation unit shown in FIG. 5, in accordance with one embodiment.

The output enable signal generation unit 110 shown in FIG. 5 can be configured to operate as shown in FIG. 6.

The first shift register 112 can be configured to receive an output signal of the first delay unit 111 and output the first output enable signal "out_en<0>." The first output enable signal "out_en<0>" can be output when a predetermined time elapses after the read command "read_command" is input to the semiconductor memory apparatus. The enable period of the first output enable signal can be the same as one cycle of the clock signal "clk."

The second shift register 113 can be configured to receive the first output enable signal "out_en<0>" and output the second output enable signal "out_en<1>." The second output enable signal "out_en<1>" can be enabled at a high level if the first output enable signal "out_en<0>" is disabled at a low level.

The third shift register 114 can be configured to receive the second output enable signal "out_en<1>" and output the third output enable signal "out_en<2>." The third output enable signal "out_en<2>" can be enabled at a high level if the second output enable signal "out_en<1>" is disabled at a low level.

The fourth shift register 115 can be configured to receive the third output enable signal "out_en<2>" and output the fourth output enable signal "out_en<3>." The fourth output enable signal "out_en<3>" can be enabled at a high level if the third output enable signal "out_en<2>" is disabled at a low level.

The fifth shift register 116 can be configured to receive the fourth output enable signal "out_en<3>" and output the fifth output enable signal "out_en<4>." The fifth output enable signal "out_en<4>" can be enabled at a high level if the fourth output enable signal "out_en<3>" is disabled at a low level.

Here, the enable period of each of the first to fifth output enable signals "out_en<0:4>" can be the same as one cycle of the clock signal "clk."

Figure 7:
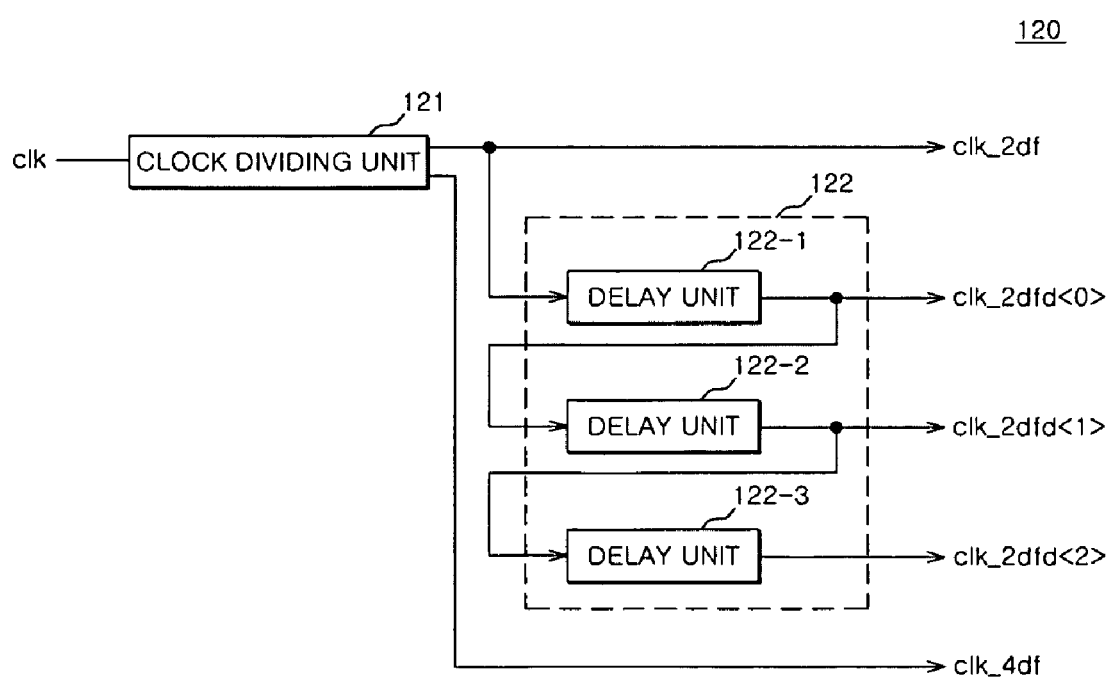
FIG. 7 is a circuit diagram showing a clock control unit that can be included in the data output control unit shown in FIG. 4, in accordance with one embodiment.

The clock control unit 120 shown in FIG. 7 can be configured to divide the clock signal "clk" and generate a divided-by-two clock signal "clk_2df" and a divided-by-four clock signal "clk_4df." In addition, the clock control unit 120 can be configured to delay the divided-by-two clock signal "clk_2df" and generate first to third delayed divided-by-two clocks signal "clk_2dfd<0:2>."

The clock control unit 120 can include a clock dividing unit 121 and a delated clock generating unit 122.

The clock dividing unit 121 can be configured to divide the clock singal "clk" and generate the divided-by-two clock signal "clk_2df" and the divided-by-four clock signal "clk_4df." The clock dividing unit 121 may be implemented with a counter.

The delayed clock generating unit 122 can be configured to delay the divided-by-two clock signal "clk_2df" and generate the first to third delayed divided-by-two clocks signal "clk_2dfd<0:2>."

The delayed clock generating unit 122 can include second to fourth delay units 122-1, 122-2, and 122-3 that are connected in series. The delay value of each of the delay units 122-1, 122-2, and 122-3 can be the same as ¼ cycle of the clock "clk."

The second delay unit 122-1 can be configured to delay the divided-by-two clock signal "clk_2df" and generate the first delayed divided-by-two clock signal "clk_2dfd<0>."

The third delay unit 122-2 can be configured to delay the first delayed divided-by-two clock signal "clk_2dfd<0>" and generate the second delayed divided-by-two clock signal "clk_2dfd<1>."

The fourth delay unit 122-3 can be configured to delay the second delayed divided-by-two clock signal "clk_2dfd<1>" and generate the third delayed divided-by-two clock signal "clk_2dfd<2>."

Figure 8:
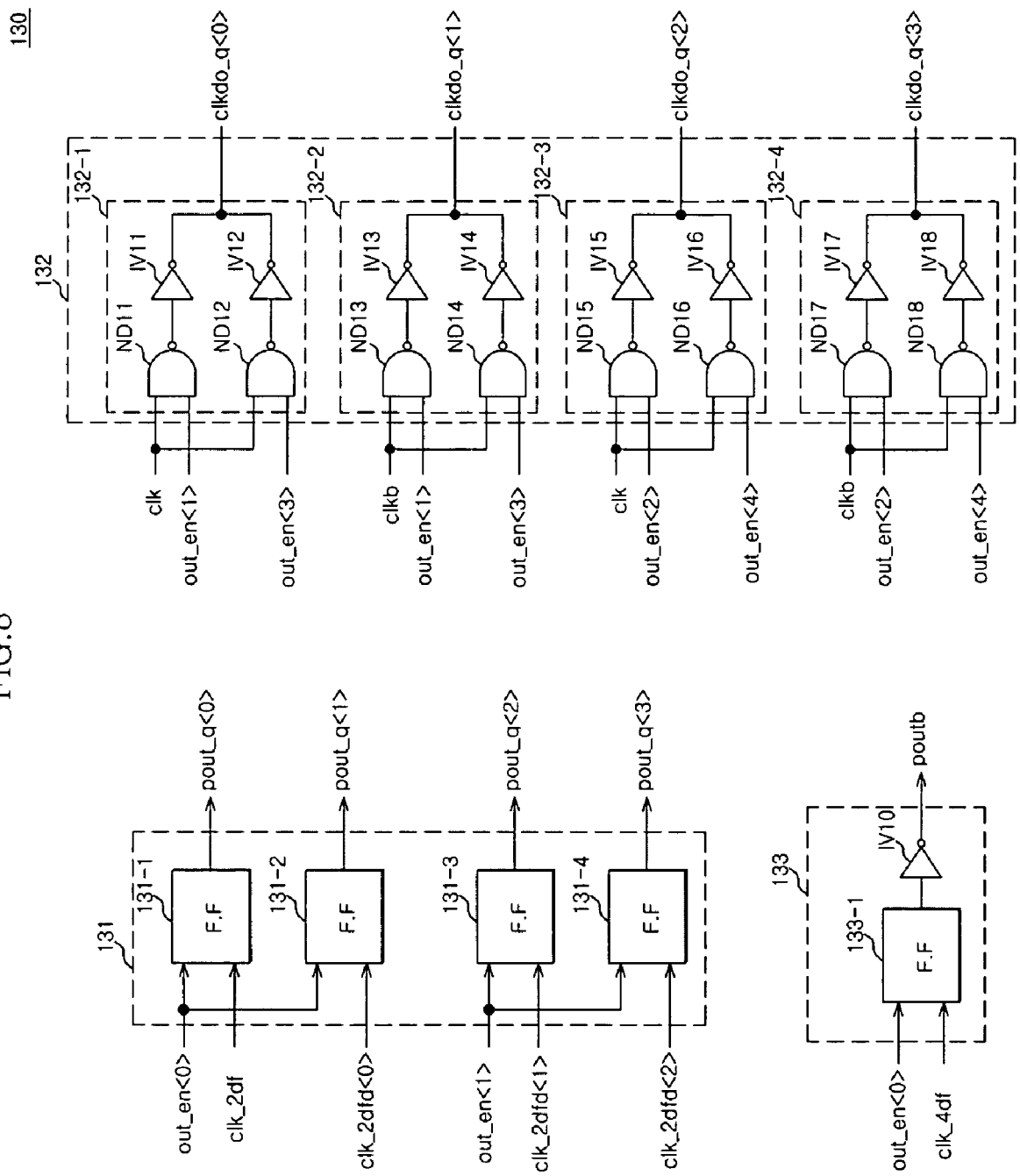
FIG. 8 is a circuit diagram showing a data output control signal generation unit that can be included in the data output control unit shown in FIG. 4, in accordance with one embodiment.

The data output control signal generation unit 130 shown in FIG. 8 can be configured to generate first to fourth selection signals "pout_q<0:3>," an input control signal "poutb," and first to fourth output timing signals "clkdo_q<0:3>" in response to the first to fifth output enable signals "out_en<0:4>," the divided-by-two clock signal "clk_2df," the divided-by-four clock signal "clk_4df," and the first to third delayed divided-by-two clocks signal "clk_2dfd<0:2>."

The data output control signal generation unit 130 can include a selection signal generating unit 131, an output timing signal generating unit 132, and an input control signal generating unit 133.

The selection signal generating unit 131 can be configured to generate the first to fourth selection signals "pout_q<0:3>" in response to the first and second output enable signals "out_en<0>" and "out_en<1>," the divided-by-two clock signal "clk_2df," and the first to third delayed divided-by-two clocks signal "clk_2dfd<0:2>."

The selection signal generating unit 131 can include first and fourth latch units 131-1, 131-2, 131-3, and 131-4. At this time, the first to fourth latch units 131-1, 131-2, 131-3, and 131-4 can be implemented with flip-flops (denoted by F.F in FIG. 8).

The first latch unit 131-1 can be configured to generate the first selection signal "pout_q<0>" in response to the divided-by-two clock signal "clk_2df" and the first output enable signal "out_en<0>." The first latch unit 131-1 cab be configured to output the level of the first output enable signal "out_en<0>" at the timing when the divided-by-two clock signal "clk_2df" is changed to a high level. That is, if the first output enable signal "out_en<0>" is at the high level at the timing when the divided-by-two clock signal "clk_2df" is changed to the high level, the first selection signal "pout_q<0>" can be changed to a high level. In addition, if the first output enable signal "out_en<0>" is at the low level at the timing when the divided-by-two clock signal "clk_2df" is next changed to the high level, the first selection signal "pout_q<0>" can be changed to a low level. Accordingly, the enable period of the first selection signal "pout_q<0>" can be the same as one cycle of the divided-by-two clock signal "clk_2df."

The second latch unit 131-2 can be configured to generate the second selection signal "pout_q<1>" in response to the first delayed divided-by-two clock signal "clk_2dfd<0>" and the first output enable signal "out_en<0>." If the first output enable signal "out_en<0>" is at the high level at the timing when the first delayed divided-by-two clock signal "clk_2dfd<0>" is changed to a high level, the second selection signal "pout_q<1>" can be changed to a high level. In addition, if the first output enable signal "out_en<0>" is at the low level at the timing when the first delayed divided-by-two clock signal "clk_2dfd<0>" is next changed to the high level, the second selection signal "pout_q<1>" can be changed to a low level. Accordingly, the enable period of the second selection signal "pout_q<1>" can be the same as one cycle of the first delayed divided-by-two clock signal "clk_2dfd<0>."

The third latch unit 131-3 generates the third selection signal "pout_q<2>" in response to the second delayed divided-by-two clock "clk_2dfd<1>" and the second output enable signal "out_en<1>." If the second output enable signal "out_en<1>" is at the high level at the timing when the second delayed divided-by-two clock signal "clk_2dfd<1>" is changed to a high level, the third selection signal "pout_q<2>" can be changed to a high level. In addition, if the second output enable signal "out_en<1>" is at the low level at the timing when the second delayed divided-by-two clock signal "clk_2dfd<1>" is next changed to the high level, the third selection signal "pout_q<2>" can be changed to a low level. Accordingly, the enable period of the third selection signal "pout_q<2>" can be the same as one cycle of the second delayed divided-by-two clock signal "clk_2dfd<1>."

The fourth latch unit (131-4) can be configured to generate the fourth selection signal "pout_q<3>" in response to the third delayed divided-by-two clock signal "clk_2dfd<2>" and the second output enable signal "out_en<1>." If the second output enable signal "out_en<1>" is at the high level at the timing when the third delayed divided-by-two clock signal "clk_2dfd<2>" is changed to a high level, the fourth selection signal "pout_q<3>" can be changed to a high level. In addition, if the second output enable signal "out_en<1>" is at the low level at the timing when the third delayed divided-by-two clock signal "clk_2dfd<2>" is next changed to the high level, the fourth selection signal "pout_q<3>" can be changed to a low level. Accordingly, the enable period of the fourth selection signal "pout_q<3>" can be the same as one cycle of the third delayed divided-by-two clock signal "clk_2dfd<2>."

The output timing signal generating unit 132 can be configured to generate the first to fourth output timing signals "clkdo_q<0:3>" in response to the clock signal "clk," an inverted clock signal "clkb," and the second to fifth output enable signals "out_en<1:4>."

The output timing signal generating unit 132 can include first to fourth signal combine units 132-1, 132-2, 132-3, and 132-4.

The first signal combine unit 132-1 can be configured to output the high-level period of the clock signal "clk" as the first output timing signal "clkdo_q<0>" during the enable periods of the second and fourth output enable signals "out_en<1>" and "out_en<3>," that is, the high-level periods thereof.

The first signal combine unit 132-1 can include first and second NAND gates (ND11) and (ND12), and first and second inverters (IV11) and (IV12). The first NAND gate (ND11) can be configured to receive the clock signal "clk" and the second output enable signal "out_en<1>." The first inverter (IV11) can be configured to invert an output signal of the first NAND gate (ND11) and output the inverted signal. The second NAND gate (ND12) can be configured to receive the clock signal "clk" and the fourth output enable signal "out_en<3>." The second inverter (IV12) can be configured to invert an output signal of the second NAND gate (ND12) and output the inverted signal. At this time, a connection node between the first inverter (IV11) and the second inverter (IV12) can become an output terminal of the first signal combine unit 132-1.

The second signal combine unit 132-2 can be configured to output the high-level period of the inverted clock signal "clkb" as the second output timing signal "clkdo_q<1>" during the enable periods of the second and fourth output enable signals "out_en<1>" and "out_en<3>," that is, the high-level periods thereof.

The second signal combine unit 132-2 can include third and fourth NAND gates (ND13) and (ND14), and third and fourth inverters (IV13) and (IV14). The third NAND gate (ND13) can be configured to receive the inverted clock signal "clkb" and the second output enable signal "out_en<1>." The third inverter (IV13) can be configured to invert an output signal of the third NAND gate (ND13) and output the inverted signal. The fourth NAND gate (ND14) can be configured to receive the inverted clock signal "clkb" and the fourth output enable signal "out_en<3>." The fourth inverter (IV14) can be configured to invert an output signal of the fourth NAND gate (ND14) and output the inverted signal. At this time, a connection node between the third inverter (IV13) and the fourth inverter (IV14) can become an output terminal of the second signal combine unit 132-2.

The third signal combine unit 132-3 can be configured to output the high-level period of the clock signal "clk" as the third output timing signal "clkdo_q<2>" during the enable periods of the third and fifth output enable signals "out_en<2>" and "out_en<4>," that is, the high-level periods thereof.

The third signal combine unit 132-3 can include fifth and sixth NAND gates (ND15) and (ND16), and fifth and sixth inverters (IV15) and (IV16). The fifth NAND gate (ND15) can be configured to receive the clock signal "clk" and the third output enable signal "out_en<2>." The fifth inverter (IV15) can be configured to invert an output signal of the fifth NAND gate (ND15) and output the inverted signal. The sixth NAND gate (ND16) can be configured to receive the clock signal "clk" and the fifth output enable signal "out_en<4>." The sixth inverter (IV16) can be configured to invert an output signal of the sixth NAND gate (ND16) and output the inverted signal. At this time, a connection node between output terminals of the fifth inverter (IV15) and the sixth inverter (IV16) can become an output terminal of the third signal combine unit 132-3.

The fourth signal combine unit 132-4 can be configured to output the high-level period of the inverted clock signal (clkb) as the fourth output timing signal "clkdo_q<3>" during the enable periods of the third and fifth output enable signals "out_en<2>" and "out_en<4>," that is, the high-level periods thereof.

The fourth signal combine unit 132-4 can include seventh and eighth NAND gates (ND17) and (ND18), and seventh and eighth inverters (IV17) and (IV18). The seventh NAND gate (ND17) can be configured to receive the inverted clock signal "clkb" and the third output enable signal "out_en<2>." The seventh inverter (IV17) can be configured to invert an output signal of the seventh NAND gate (ND17) and output the inverted signal. The eighth NAND gate (ND18) can be configured to receive the inverted clock signal "clkb" and the fifth output enable signal "out_en<4>." The eighth inverter (IV18) can be configured to invert an output signal of the eighth NAND gate (ND18) and output the inverted signal. At this time, a connection node between output terminals of the seventh inverter (IV17) and the eighth inverter (IV18) becomes an output terminal of the fourth signal combine unit 132-4.

The input control signal generating unit 133 can be configured to generate the input control signal "poutb" in response to the first output enable signal "out_en<0>" and the divided-by-four clock signal "clk_4df."

The input control signal generating unit 133 can be configured to invert the first output enable signal "out_en<0>" at the timing when the divided-by-four clock signal "clk_4df" is changed to the high level, and output the inverted signal as the input control signal "poutb." That is, at the timing when the divided-by-four clock signal "clk_4df" is changed to the high level, if the first output enable signal "out_en<0>" is at the high level, the input control signal "poutb" can be output at the low level. In addition, at the timing when the divided-by-four clock signal "clk_4df" is next changed to the high level, if the first output enable signal "out_en<0>" is at the low level, the input control signal "poutb" can be output at the high level. Accordingly, the enable period of the input control signal "poutb" can be the same as one cycle of the divided-by-four clock signal "clk_4df."

The input control signal generating unit 133 can include a flip-flop 133-1 (denoted by F.F in FIG. 8) and an inverter (IV10). The flip-flop 133-1 can be configured to receive the divided-by-four clock signal "clk_4df" and the first output enable signal "out_en<0>." The inverter (IV10) can be configured to invert an output signal of the flip-flop 133-1 and output the inverted signal as the input control signal "poutb."

Figure 9:
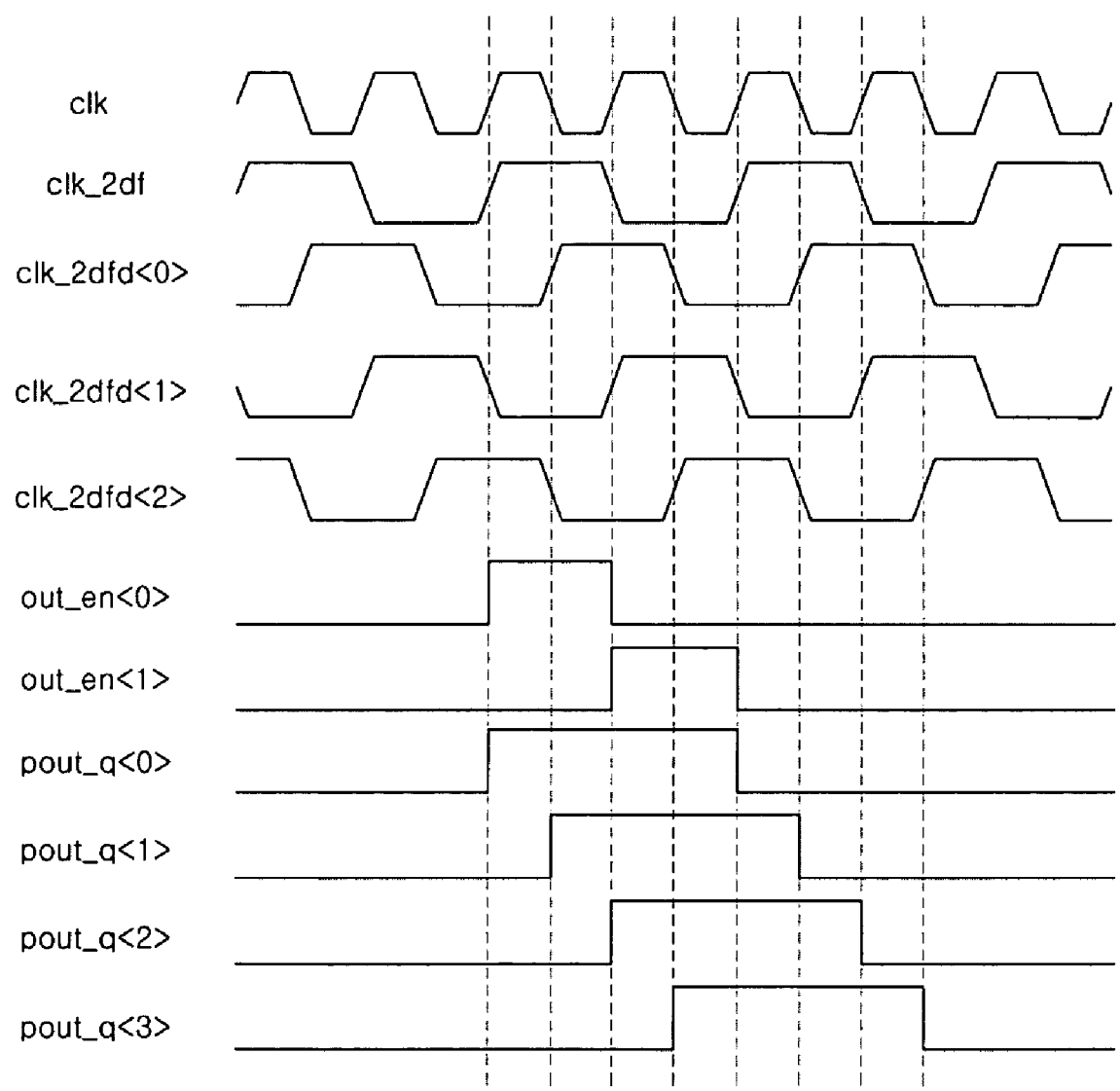
FIGS. 9 and 10 are timing charts of the clock control unit shown in FIG. 7 and a selection signal generating unit shown in FIG. 8, and an output timing signal generating unit shown in FIG. 8, in accordance with one embodiment.

FIG. 9 is a timing chart of the clock control unit 120 shown in FIG. 7 and the selection signal generating unit 131 shown in FIG. 8.

The divided-by-two clock signal "clk_2df" can be generated by dividing-by-two the clock signal "clk."

The first delayed divided-by-two clock signal "clk_2dfd<0>" can be generated by delaying the divided-by-two clock signal "clk_2df" by ¼ cycle of the clock signal "clk."

The second delayed divided-by-two clock signal "clk_2dfd<1>" can be generated by delaying the first delayed divided-by-two clock signal "clk_2dfd<1>" by ¼ cycle of the clock signal "clk."

The third delayed divided-by-two clock signal "clk_2dfd<2>" can be generated by delaying the second delayed divided-by-two clock signal "clk_2dfd<1>" by ¼ cycle of the clock signal "clk."

At the timing when the divided-by-two clock signal "clk_2df" is changed to the high level, since the first output enable signal "out_en<0>" is at the high level, the first selection signal "pout_q<0>" can be changed to the high level. In addition, at the timing when the divided-by-two clock signal "clk_2df" is next changed to the high level, since the first output enable signal "out_en<0>" is at the low level, the first selection signal "pout_q<0>" can be changed to the low level. That is, the enabled period of the first selection signal "pout_q<0>," that is, the high-level period thereof, can be the same as one cycle of the divided-by-two clock signal "clk_2df."

At the time when the first delayed divided-by-two clock signal "clk_2dfd<0>" is changed to the high level, since the first output enable signal "out_en<0>" is at the high level, the second selection signal "pout_q<1>" can be changed to the high level. In addition, at the time when the first delayed divided-by-two clock signal "clk_2dfd<0>" is next changed to the high level, since the first output enable signal "out_en<0>" is at the low level, the second selection signal "pout_q<1>" can be changed to the low level. That is, the enable period of the second selection signal "pout_q<1>," that is, the high-level period thereof, can be the same as one cycle of the first delayed divided-by-two clock signal "clk_2dfd<0>."

At the timing when the second delayed divided-by-two clock signal "clk_2dfd<1>" is changed to the high level, since the second output enable signal "out_en<1>" is at the high level, the third selection signal "pout_q<2>" can be changed to the high level. In addition, at the time when the second delayed divided-by-two clock signal "clk_2dfd<1>" is next changed to the high level, since the second output enable signal out_en<1> is at the low level, the third selection signal "pout_q<2>" can be changed to the low level. That is, the enable period of the third selection signal "pout_q<2>," that is, the high-level period thereof, can be the same as one cycle of the second delayed divided-by-two clock signal "clk_2dfd<1>."

At the timing when the third delayed divided-by-two clock signal "clk_2dfd<2>" is changed to the high level, since the second output enable signal "out_en<1>" is at the high level, the fourth selection signal "pout_q<3>" can be changed to the high level. In addition, at the timing when the third delayed divided-by-two clock signal "clk_2dfd<2>" is next changed to the high level, since the second output enable signal "out_en<1>" is at the low level, the fourth selection signal "pout_q<3>" can be changed to the low level. That is, the enable period of the fourth selection signal "pout_q<3>," that is, the high-level period thereof, can be the same as one cycle of the third delayed divided-by-two clock signal "clk_2dfd<2>."

Figure 10:
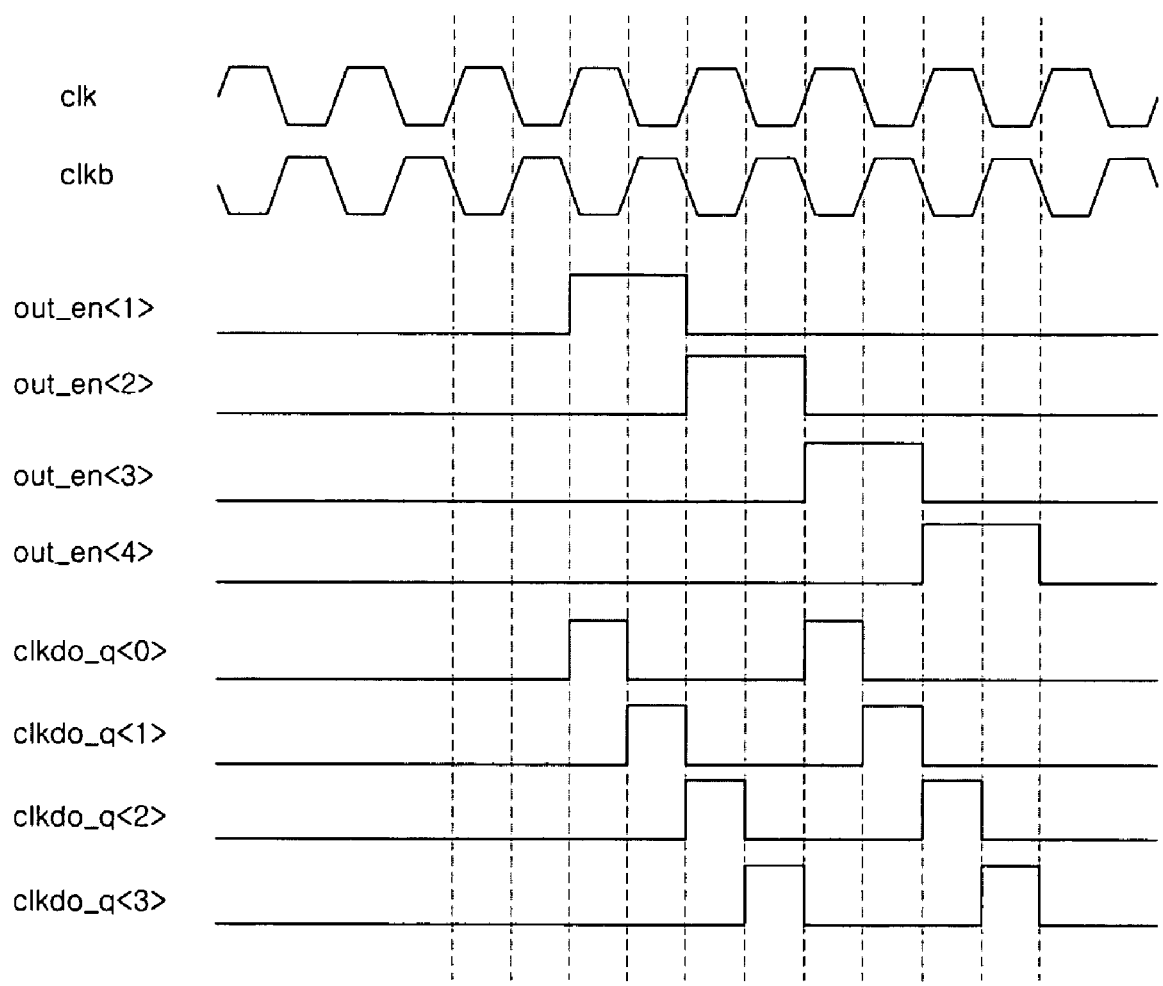

FIG. 10 is a timing chart of the output timing signal generating unit shown in FIG. 8, in accordance with one embodiment.

The first output timing signal "clkdo_q<0>" is at the high level only during a period in which the enable period of each of the second output enable signal "out_en<1>" and the fourth output enable signal "out_en<3>," that is, the high-level period thereof, overlaps the high-level period of the clock signal "clk."

The second output timing signal "clkdo_q<1>" is at the high level only during a period in which the enable period of each of the second output enable signal "out_en<1>" and the fourth output enable signal "out_en<3>," that is, the high-level period thereof, overlaps the high-level period of the inverted clock signal "clkb."

The third output timing signal "clkdo_q<2>" is at the high level only during a period in which the enable period of each of the third output enable signal "out_en<2>" and the fifth output enable signal "out_en<4>," that is, the high-level period thereof, overlaps the high-level period of the clock signal "clk."

The fourth output timing signal "clkdo_q<3>" is at the high level only during a period in which the enable period of each of the third output enable signal "out_en<2>" and the fifth output enable signal "out_en<4>," that is, the high-level period thereof, overlaps the high-level period of the inverted clock signal "clkb."

Figure 11:
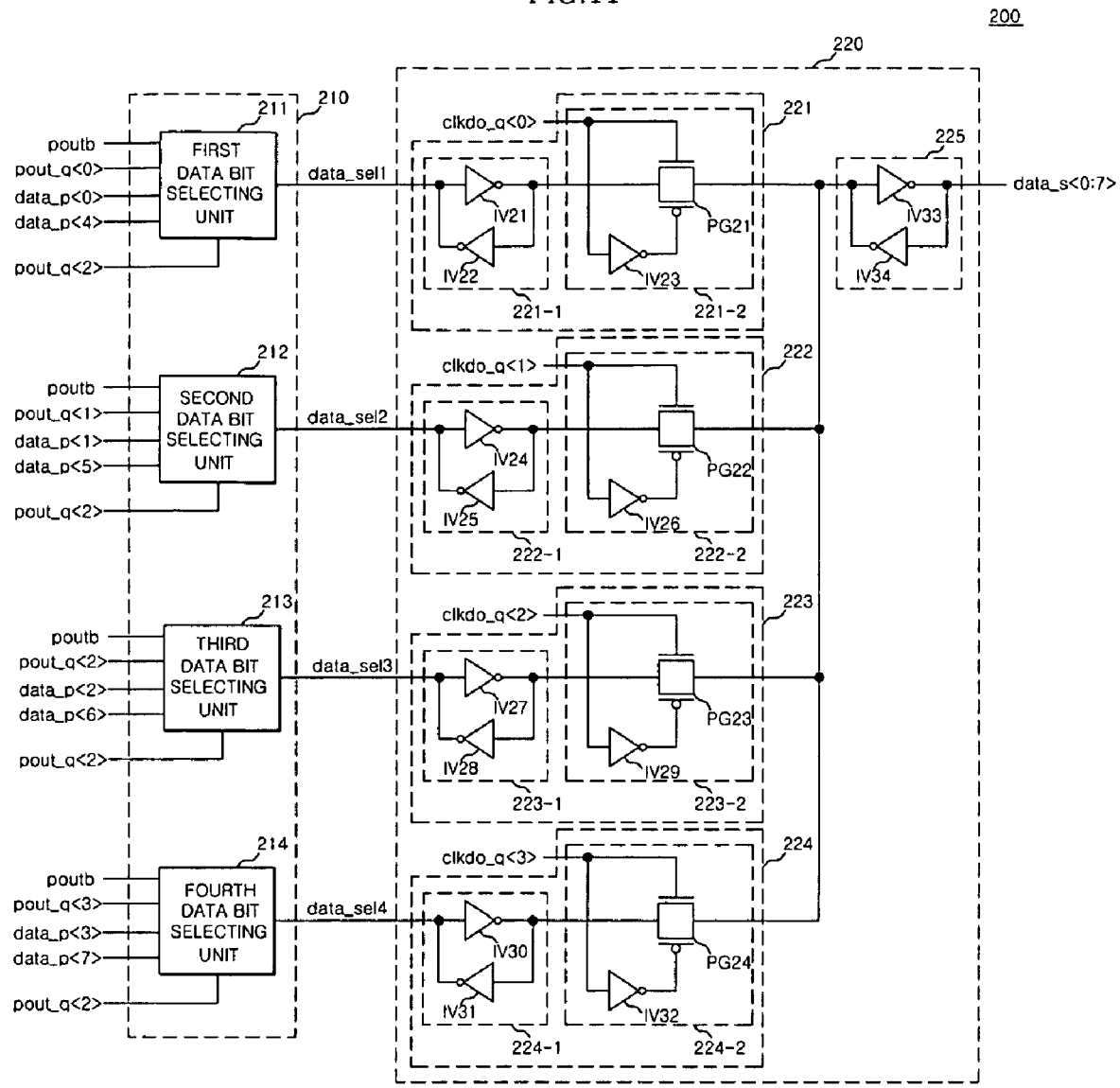
FIG. 11 is a circuit diagram showing a data output unit that can be included in the apparatus shown in FIG. 3, in accordance with one embodiment.

The signal-responsive data output unit 200 shown in FIG. 11 can be configured to sequentially output the parallel data "data_p<0:7>" as the serial data "data_s<0:7>" in response to the output control signals "pout_q<0:3>," "clkdo_q<0:3>," and "poutb." At this time, the output control signals "pout_q<0:3>," "clkdo_q<0:3>," and "poutb" can include the first to fourth selection signals "pout_q<0:3>," the first to fourth output timing signals "clkdo_q<0:3>," and the input control signal "poutb."

The signal-responsive data output unit 200 can include a data selection unit 210 and a data output unit 220.

The data selection unit 210 can be configured to store the parallel data "data_p<0:7>" in response to the input control signal "poutb," and output the parallel data "data_p<0:7>" as first to fourth selected data "data_sel1," "data_sel2," "data_sel3," and "data_sel4" in response to the first to fourth selection signals "pout_q<0:3>."

The data selection unit 210 can include first to fourth data bit selecting units 211 to 214.

The first data bit selecting unit 211 can be configured to store zero-th data "data_p<0>" and fourth data "data_p<4>" of the parallel data "data_p<0:7>" in response to the input control signal "poutb." In addition, the first data bit selecting unit 211 can be configured to sequentially output the zero-th data "data_p<0>" and the fourth data "data_p<4>" as the first selected data "data_sel1" in response to the first selection signal "pout_q<0>" and the third selection signal "pout_q<2>."

The second data bit selecting unit 212 can be configured to store first data "data_p<1>" and fifth data "data_p<5>" of the parallel data "data_p<0:7>" in response to the input control signal "poutb." In addition, the second data bit selecting unit 212 can be configured to sequentially output the first data "data_p<1>" and the fifth data "data_p<5>" as the second selected data "data_sel2" in response to the second selection signal "pout_q<1>" and the third selection signal "pout_q<2>."

The third data bit selecting unit 213 can be configured to store second data "data_p<2>" and sixth data "data_p<6>" of the parallel data "data_p<0:7>" in response to the input control signal "poutb." In addition, the third data bit selecting unit 213 can be configured to sequentially output the second data "data_p<2>" and the sixth data "data_p<6>" as the third selected data "data_sel3" in response to the third selection signal "pout_q<2>."

The fourth data bit selecting unit 214 can be configured to store third data "data_p<3>" and seventh data "data_p<7>" of the parallel data "data_p<0:7>" in response to the input control signal "poutb." In addition, the fourth data bit selecting unit 214 can be configured to sequentially outputs the third data "data_p<3>" and the seventh data "data_p<7>" as the fourth selected data "data_sel4" in response to the fourth selection signal "pout_q<3>" and the third selection signal "pout_q<2>."

The data output unit 220 can be configured to output the first to fourth selected data "data_sel1," "data_sel2," "data_sel3," and "data_sel4" as the serial data "data_s<0:7>" in response to the first to fourth output timing signals "clkdo_1<0:3>."

The data output unit 220 can include first to fourth output control units 221 to 224, and a sixth latch unit 225.

The first output control unit 221 can be configured to output the first selected data "data_sel1" in synchronization with the first output timing signal "clkdo_q<0>."

The first output control unit 221 can include a seventh latch unit 221-1 and a first synchronizing unit 221-2.

The seventh latch unit 221-1 can include ninth and tenth inverters (IV21) and (IV22). The ninth inverter (IV21) can be configured to receive the first selected data "data_sel1." The tenth inverter (IV22) can be configured to receive and invert an output signal of the ninth inverter (IV21), and output the inverted signal to the ninth inverter (IV21).

The first sychronizing unit 221-2 can include a switching element, for example, a first pass gate (PG21), and an eleventh inverter (IV23).

The eleventh inverter (IV23) can be configured to invert the first output timing signal "clkdo_q<0>."

The first pass gate (PG21) can be configured to output an output signal of the ninth inverter (IV21) as zero-th and fourth serial data "data_s<0>" and "data_s<4>" of the serial data "data_s<0:7>" in response to the first output timing signal "clkdo_q<0>" and an output signal of the eleventh inverter (IV23).

The second output control unit 222 can be configured to output the second selected data "data_sel2" in synchronization with the second output timing signal "clkdo_q<1>."

The second output control unit 222 can include an eighth latch unit 222-1 and a second synchronizing unit 222-2.

The eighth latch unit 222-1 can include twelfth and thirteenth inverters (IV24) and (IV25). The twelfth inverter (IV24) can be configured to receive the second selected data "data_sel1." The thirteenth inverter (IV25) can be configured to receive and invert an output signal of the twelfth inverter (IV24), and output the inverted signal to the twelfth inverter (IV24).

The second synchronizing unit 222-2 can include a switching element, for example, a second pass gate (PG22), and a fourteenth inverter (IV26).

The fourteenth inverter (IV26) can be configured to invert the second output timing signal "clkdo_q<1>."

The second pass gate (PG22) can be configured to output an output signal of the twelfth inverter (IV24) as first and fifth serial data "data_s<1>" and "data_s<5>" of the serial data "data_s<0:7>" in response to the second output timing signal "clkdo_q<1>" and an output signal of the fourteenth inverter (IV26).

The third output control unit 223 can be configured to output the third selected data "data_sel3" in synchronization with the third output timing signal "clkdo_q<2>."

The third output control unit 223 can include a ninth latch unit 223-1 and a third synchronizing unit 223-2.

The ninth latch unit 223-1 can include fifteenth and sixteenth inverters (IV27) and (IV28). The fifteenth inverter (IV27) can be configured to receive the third selected data "data_sel3." The sixteenth inverter (IV28) can be configured to receive and invert an output signal of the fifteenth inverter (IV27), and output the inverted signal to the fifteenth inverter (IV27).

The third sychronizing unit 223-2 can include a switching element, for example, a third pass gate (PG23), and a seventeenth inverter (IV29).

The seventeenth inverter (IV290 can be configured to invert the third output timing signal "clkdo_q<2>."

The third pass gate (PG23) can be configured to output an output signal of the sixteenth inverter (IV27) as second and sixth serial data "data_s<2>" and "data_s<6>" of the serial data "data_s<0:7>" in response to the third output timing signal "clkdo_q<2>" and an output signal of the seventeenth inverter (IV29).

The fourth output control unit 224 can be configured to output the fourth selected data "data_sel4" in synchronization with the fourth output timing signal "clkdo_q<3>."

The fourth output control unit 224 can include a tenth latch unit 224-1 and a fourth synchronizing unit 224-2.

The tenth latch unit 224-1 can include eighteenth and nineteenth inverters (IV30) and (IV31). The eighteenth inverter (IV30) can be configured to receive the fourth selected data "data_sel4." The nineteenth inverter (IV31) can be configured to receive and invert an output signal of the eighteenth inverter (IV30), and output the inverted signal to the eighteenth inverter (IV30).

The fourth synchronizing unit 224-2 can include a switching element, for example, a fourth pass gate (PG24), and a twentieth inverter (IV32).

The twentieth inverter (IV32) can be configured to invert the fourth output timing signal "clkdo_q<3>."

The fourth pass gate PG24 can be configured to output an output signal of the twentieth inverter (IV32) as third and seventh serial data "data_s<3>" and "data_s<7>" of the serial data "data_s<0:7>" in response to the fourth output timing signal "clkdo_q<3>" and an output signal of the twentieth inverter (IV32).

The sixth latch unit 225 can be connected to a common node between the output terminals of the first to fourth output control units 221 to 224. That is, the sixth latch unit 225 can be configured to sequentially output the zero-th data "data_s<0>," the first data "data_s<1>," the second data "data_s<2>," the third data "data_s<3>," the fourth data "data_s<4>," the fifth data "data_s<5>," the sixth data "data_s<6>," and the seventh data "data_s<7>" as the serial data "data_s<0:7>."

The sixth latch unit 225 can include twenty-first and twenty-second inverters (IV33) and (IV340. The twenty-first inverter (IV33) can be connected to the common node between the output terminals of the first to fourth output control units 221 to 224. The twenty-second inverter (IV34) can be configured to invert an output signal of the twenty-first inverter (IV33) and output the inverted signal as an input signal of the twenty-first inverter (IV33). In addition, the twenty-first inverter (IV33) can be configured to output an output signal of the sixth latch unit 225.

Figure 12:
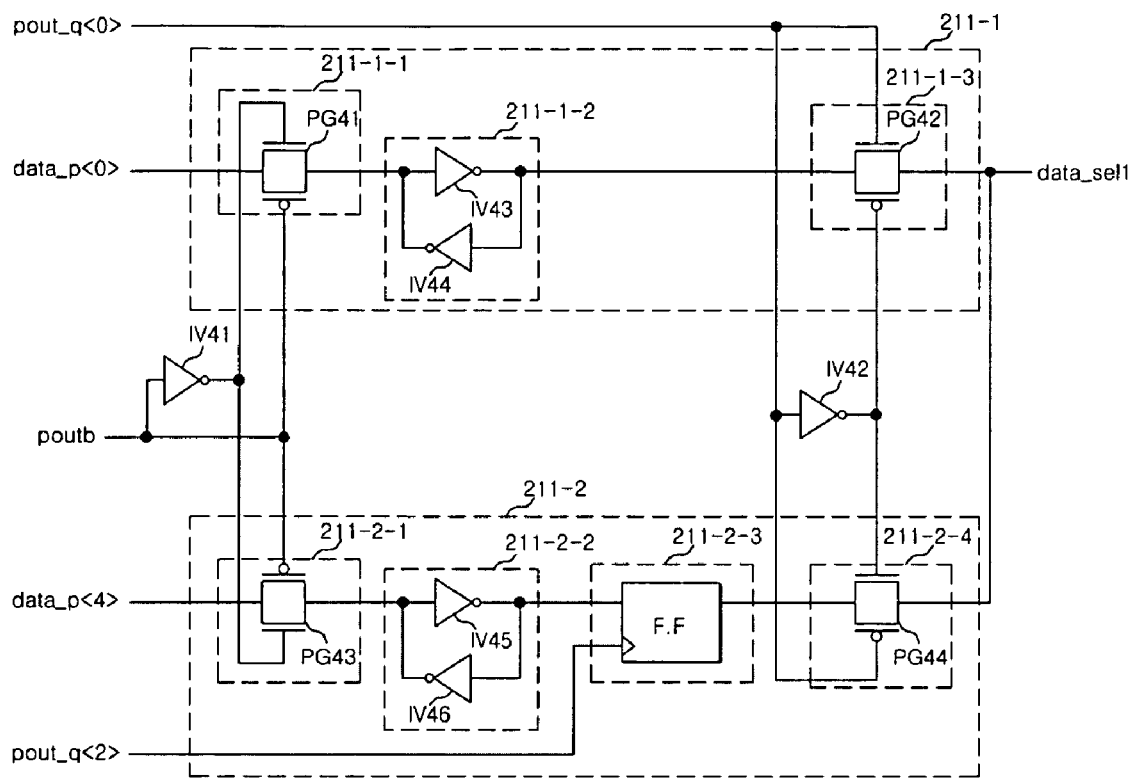
FIG. 12 is a circuit diagram showing a first data bit selecting unit that can be included in the data output unit shown in FIG. 11, in accordance with one embodiment.

FIG. 12 is a circuit diagram of the first data bit selecting unit shown in FIG. 11.

The first to fourth data bit selecting units 211 to 214 commonly receive the input control signal "poutb" and the third selection signal "pout_q<2>." The first to fourth data bit selecting units 211 to 214 can have the same configuration, except that different parallel data "data_p<0:7>" and selection signals "pout_q<0:3>" are input. Here, only the first data bit selecting unit 211 will be described.

The first data bit selecting unit 211 can be configured to store the zero-th data "data_p<0>" and the fourth data "data_p<4>" of the parallel data "data_p<0:7>" in response to the input control signal "poutb." In addition, the first data bit selecting unit 211 can be configured to output the zero-th data "data_p<0>" and the fourth data "data_p<4>" as the first selected data "data_sel1" in response to the first selection signal "pout_q<0>" and the third selection signal "pout_q<2>."

The first data bit selecting unit 211 can include a first selecting unit 211-1, a second selecting unit 211-2, and twenty-third and twenty-fourth inverters (IV41) and (IV42). A connection node between the output terminals of the first selecting unit 211-1 and the second selecting unit 211-2 can be configured to become an output terminal of the first data bit selecting unit 211. Here, the twenty-third inverter (IV41) can be configured to invert the input control signal "poutb" and output the inverted signal. The twenty-fourth inverter (IV42) can be configured to invert the first selection signal "pout_q<0>" and output the inverted signal.

The first selecting unit 211-1 can be configured to receive and store the zero-th data "data_p<0>" of the parallel data "data_p<0:7>" when the input control signal "poutb" is enabled, that is, at the low level. In addition, when the first selection signal "pout_q<0>" is enabled, that is, at the high level, the first selecting unit 211-1 can be configured to output the stored zero-th data "data_p<0>" as the first selected data "data_sel1."

The first selecting unit 211-1 can include a first input unit 211-1-1, an eleventh latch unit 211-1-2, and a first output unit 211-1-3.

The first input unit 211-1-1 can be composed of a switching element that is turned on when the input control signal "poutb" is at the low level and output the zero-th data "data_p<0>" to the eleventh latch unit 211-1-2.

For example, the first input unit 211-1-1 can be composed of a fifth pass gate (PG41) that outputs the zero-th data "data_p<0>" in response to the input control signal "poutb" and an output signal of the twenty-third inverter (IV41).

The eleventh latch unit 211-1-2 can be configured to store an output signal of the first input unit 211-1-1.

The eleventh latch unit 211-1-2 can include twenty-fifth and twenty-sixth inverters (IV43) and (IV44). The twenty-fifth inverter (IV43) can be configured to receive and invert the output signal of the first input unit 211-1-1, and output the inverted signal to the first output unit 211-1-3. The twenty-sixth inverter (IV44) can be configured to receive and invert an output signal of the twenty-fifth inverter (IV43), and output the inverted signal as an input signal of the twenty-fifth inverter (IV43).

The first output unit 211-1-3 can be configured to output an output signal of the eleventh latch unit 211-1-2 as the first selected data "data_sel1" when the first selection signal "pout_q<0>" is enabled, that is, at the high level.

The first output unit 211-1-3 can be composed of a switching element, for example, a sixth pass gate (PG42). The sixth pass gate (PG42) can be configured to output the signal of the eleventh latch unit 211-1-2 as the first selected data "data_sel1" in response to the first selection signal "pout_q<0>" and an output signal of the twenty-fourth inverter (IV42).

The second selecting unit 211-2 can be configured to receive and store the fourth data "data_p<4>" of the parallel data "data_p<0:7>" when the input control signal "poutb" is enabled, that is, at the low level. In addition, the second selecting unit 211-2 can be configured to output the stored fourth data "data_p<4>" as the first selected data "data_sel1" when the first selection signal "pout_q<0>" is disabled, that is, at the low level.

The second selecting unit 211-2 can include a second input unit 211-2-1, a twelfth latch unit 211-2-2, and a second output unit 211-2-4. In addition, the second selecting unit 211-2 can further include a control latch unit 211-2-3 that can be configured to output an output signal of the twelfth latch unit 211-2-2 to the second output unit 211-2-4 in response to the third selection signal "pout_q<2>."

The second input unit 211-2-1 can be composed of a switching element that can be turned on when the input control signal "poutb" is at the low level and output the fourth data "data_p<4>" to the twelfth latch unit 211-2-2.

For example, the second input unit 211-2-1 can be composed of a seventh pass gate (PG43) that outputs the fourth data "data_p<4>" in response to the input control signal "poutb" and the output signal of the twenty-third inverter (IV41).

The twelfth latch unit 211-2-2 can be configured to store an output signal of the second input unit 211-2-1.

The twelfth latch unit 211-2-2 can include twenty-seventh and twenty-eighth inverters (IV450 and (IV460. The twenty-seventh inverter (IV45) can be configured to receive and invert the output signal of the second input unit 211-2-1, and output the inverted signal to the control latch unit 211-2-3. The twenty-eighth inverter (IV46) can be configured to receive and invert an output signal of the twenty-seventh inverter (IV45), and output the inverted signal as an input signal of the twenty-seventh inverter (IV45).

The control latch unit 211-2-3 can be composed of a flip-flop (denoted by F.F in FIG. 12) that outputs an output signal of the twelfth latch unit 211-2-2 to the second output unit 211-2-4 in response to the third selection signal "pout_q<2>."

The control latch unit 211-2-3 can be configured to output the output signal of the twelfth latch unit 211-2-2 to the second output unit 211-2-4 when the third selection signal "pout_q<2>" is disabled.

The second output unit 211-2-4 can be configured to output an output signal of the control latch unit 211-2-3 as the first selected data "data_sel1" when the first selection signal "pout_q<0>" is disabled, that is, at the high level.

The second output unit 211-2-4 can be composed of a switching element, for example, an eighth pass gate (PG44). The eighth pass gate (PG44) can be configured to output the output signal of the control latch unit 211-2-3 as the first selected data "data_sel1" in response to the first selection signal "pout_q<0>" and the output signal of the twenty-fourth inverter (IV42).

Figure 13:
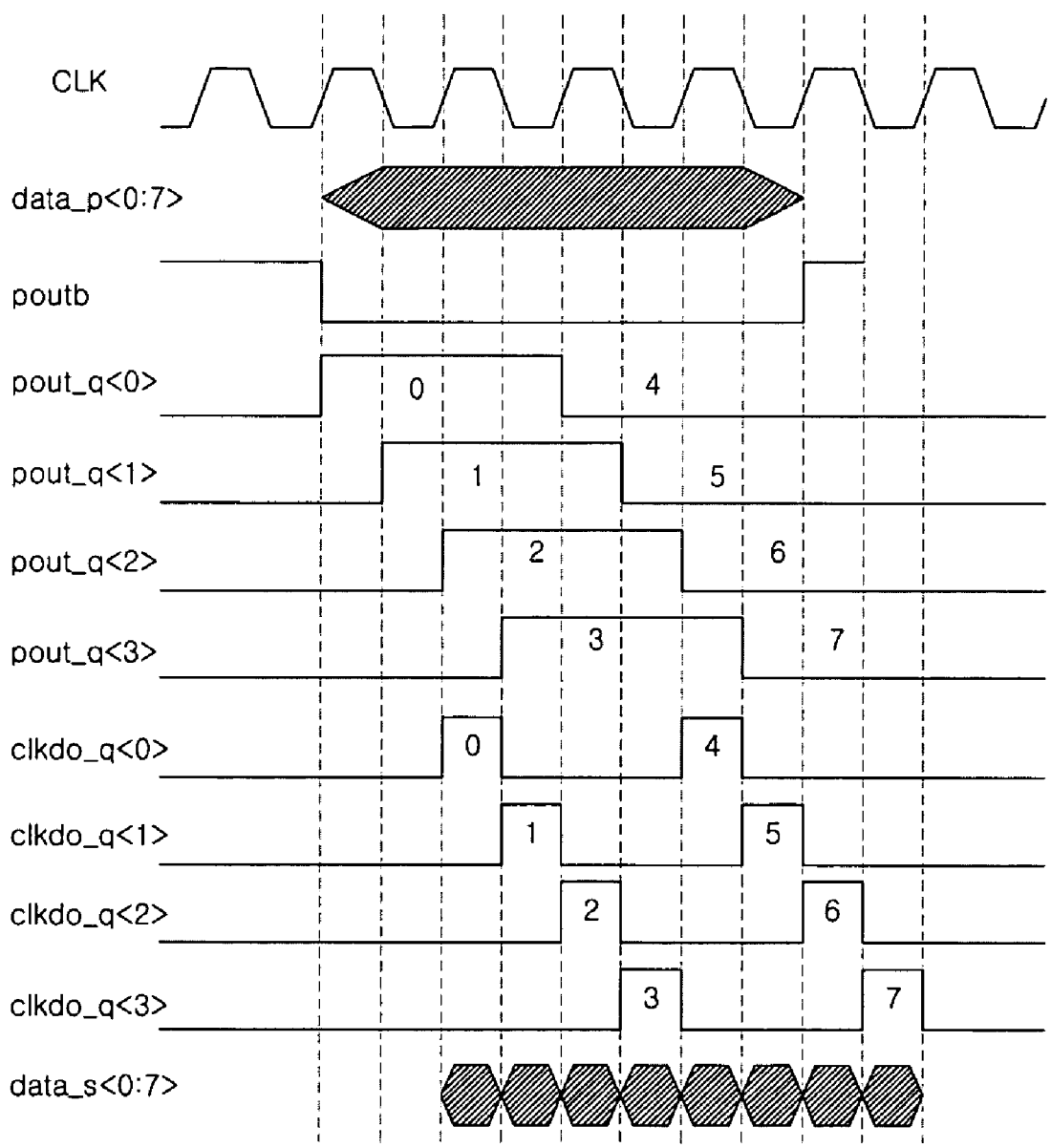
FIG. 13 is a data output timing chart of a data output circuit, in accordance with one embodiment.

FIG. 13 is a data output timing chart of the data output circuit according to the embodiment of the invention.

When a predetermined time elapses after the read command is input to the semiconductor memory apparatus, the semiconductor memory apparatus can be configured to output data. At this time, in the semiconductor memory apparatus, how many bits of data can be output with respect to a single read command is set. FIG. 13 is a timing chart of a data output circuit that outputs 8-bit data with respect to a single read command. In addition, if a single read command is input to the semiconductor memory apparatus, 8-bit data at a prescribed address can be input to the data output circuit at one time and is then sequentially output therefrom. Here, data that can be input to the data output circuit is referred to as parallel data, and data that is output from the data output circuit can be referred to as serial data.

The data output circuit can be configured to receive 8-bit parallel data "data_p<0:7>" during the enable period of the input control signal "poutb," that is, the low-level period thereof, generated after the read command is input.

The first data bit selecting unit 211 shown in FIG. 11 can be configured to sequentially output zero-th data "data_p<0>" and fourth data "data_p<4>" of the 8-bit parallel data "data_p<0:7>" as first selected data "data_sel1" in response to the first selection signal "pout_q<0>." That is, the zero-th data "data_p<0>" can be output as the first selected data "data_sel1" when the first selection signal "pout_q<0>" is enabled, that is, at the high level, and the fourth data "data_p<4>" can be output as the first selected data "data_sel1" when the first selection signal "pout_q<0>" is disabled, that is, at the low level.

The second data bit selecting unit 212 can be configured to sequentially output first data "data_p<1>" and fifth data "data_p<5>" of the 8-bit parallel data "data_p<0:7>" as second selected data "data_sel2" in response to the second selection signal "pout_q<1>." That is, the first data "data_p<1>" can be output as the second selected data "data_sel2" when the second selection signal "pout_q<1>" is enabled, that is, at the high level, and the fifth data "data_p<5>" can be output as the second selected data "data_sel2" when the second selection signal "pout_q<1>" is disabled, that is, at the low level.

The third data bit selecting unit 213 can be configured to sequentially output second data "data_p<2>" and sixth data "data_p<6>" of the 8-bit parallel data data_"p<0:7>" as third selected data "data_sel3" in response to the third selection signal "pout_q<2>." That is, the second data "data_p<2>" can be output as the third selected data "data_sel3" when the third selection signal "pout_q<2>" is enabled, that is, at the high level, and the sixth data "data_p<6>" can be output as the third selected data "data_sel3" when the third selection signal "pout_q<2>" is disabled, that is, at the low level.

The fourth data bit selecting unit 214 can be configured to sequentially output third data "data_p<3>" and seventh data "data_p<7>" of the 8-bit parallel data "data_p<0:7>" as fourth selected data "data__4" in response to the fourth selection signal "pout_q<3>." That is, the third data "data_p<3>" can be output as the fourth selected data "data_sel4" when the fourth selection signal "pout_q<3>" is enabled, that is, at the high level, and the seventh data "data_p<7>" can be output as the fourth selected data "data_sel4" when the fourth selection signal "pout_q<3>" is disabled, that is, at the low level.

The first output control unit 221 can be configured to output the first selected data "data_sel1" as the serial data "data_s<0:7>" in response to the first output timing signal "clkdo_q<0>."

When the first selected data "data_sel1" is the zero-th data "data_p<0>," the first output control unit 221 can be configured to output the first selected data "data_sel1" as the serial data "data_s<0:7>" during the first high-level period of the first output timing signal "clkdo_q<0>." In addition, when the first selected data "data_sel1" is the fourth data "data_p<4>," the first output control unit 221 can be configured to output the first selected data "data_sel1" as the serial data "data_s<0:7>" during the second high-level period of the first output timing signal "clkdo_q<0>."

The second output control unit 222 can be configured to output the second selected data "data_sel2" as the serial data "data_s<0:7>" in response to the second output timing signal "clkdo_q<1>."

When the second selected data "data_sel2" is the first data "data_p<1>," the second output control unit 222 can be configured to output the second selected data "data_sel2" as the serial data "data_s<0:7>" during the first high-level period of the second output timing signal "clkdo_q<1>." In addition, when the second selected data "data_sel2" is the fifth data "data_p<5>," the second output control unit 222 can be configured to output the second selected data "data_sel2" as the serial data "data_s<0:7>" during the second high-level period of the second output timing signal "clkdo_q<1>."

The third output control unit 223 can be configured to output the third selected data "data_sel3" as the serial data "data_s<0:7>" in response to the third output timing signal "clkdo_q<2>."

When the third selected data "data_sel3" is the second data "data_p<2>," the third output control unit 223 can be configured to output the third selected data "data_sel3" as the serial data "data_s<0:7>" during the first high-level period of the third output timing signal "clkdo_q<2>." In addition, when the third selected data "data_sel3" is the sixth data "data_p<6>," the third output control unit 223 can be configured to output the third selected data "data_sel3" as the serial data "data_s<0:7>" during the second high-level period of the third output timing signal "clkdo_q<2>."

The fourth output control unit 224 can be configured to output the fourth selected data "data_sel4" as the serial data "data_s<0:7>" in response to the fourth output timing signal "clkdo_q<3>."

When the fourth selected data "data_sel4" is the third data "data_p<3>," the fourth output control unit 224 can be configured to output the fourth selected data "data_sel4" as the serial data "data_s<0:7>" during the first high-level period of the fourth output timing signal "clkdo_q<3>." In addition, when the fourth selected data "data_sel4" is the seventh data "data_p<7>," the fourth output control unit 224 can be configured to output the fourth selected data "data_sel4" as the serial data "data_s<0:7>" during the second high-level period of the fourth output timing signal "clkdo_q<3>."

According to the data output circuit of the various embodiment described above, unlike the known circuit, data can be output without using a rising clock and a falling clock.

According to the various embodiments of the data output circuit for a semiconductor memory apparatus, the number of signals for data output can be reduced, thereby reducing the area of the semiconductor memory apparatus. In addition, according to the various embodiments of the data output circuit for a semiconductor memory apparatus, since the rising clock and the falling clock are not used, the operation stability of the semiconductor memory apparatus against the clock skew can be improved.

It will be apparent to those skilled in the art that various modifications and changes may be made without departing from the scope and spirit of the embodiments described herein. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A data output circuit for a semiconductor memory apparatus, comprising:
   a data output control unit that generates a selection signal, an output timing signal, and an input control signal in response to a read command and a clock; and
   a signal-responsive data output unit that receives parallel data in response to the input control signal, arranges the parallel data in response to the selection signal, and sequentially outputs the arranged parallel data as serial data in synchronization with the output timing signal.

2. The data output circuit of claim 1,
   wherein the data output control unit includes:
   an output enable signal generation unit that, when the read command is input, generates an output enable signal in synchronization with the clock;
   a clock control unit that divides the clock to generate a divided-by-two clock and a divided-by-four clock, and delays the divided-by-two clock to generate a delayed divided-by-two clock; and
   a data output control signal generation unit that generates the selection signal, the input control signal, and the output timing signal in response to the clock, the output enable signal, the divided-by-two clock, the delayed divided-by-two clock, and the divided-by-four clock.

3. The data output circuit of claim 2,
   wherein, when a predetermined time elapses after the read command is input to the semiconductor memory apparatus, the output enable signal generation unit generates a plurality of output enable signals that have an enable period corresponding to one cycle of the clock and different enable timings.

4. The data output circuit of claim 3,
wherein, if a first enabled output enable signal among the plurality of output enable signals is disabled, the output enable signal generation unit causes a next output enable signal to be enabled.

5. The data output circuit of claim 2,
wherein the clock control unit includes:
a clock dividing unit that receives the clock and generates the divided-by-two clock and the divided-by-four clock; and
a delated clock generating unit that delays the divided-by-two clock to generate a plurality of delayed divided-by-two clocks.

6. The data output circuit of claim 5,
wherein the plurality of delayed divided-by-two clocks have different phases from each other.

7. The data output circuit of claim 2,
wherein the data output control signal generation unit generates the input control signal for inputting the parallel data to the signal-responsive data output unit, the selection signal for determining an output sequence of data of the parallel data, and the output timing signals for determining the output timing of data of the parallel data.

8. The data output circuit of claim 7,
wherein the data output control signal generation unit includes:
a selection signal generating unit that generates the selection signal in response to the output enable signal, the divided-by-two clock, and the delayed divided-by-two clock;
an input control signal generating unit that generates the input control signal in response to an output enable signal to be first enabled among the output enable signals and the divided-by-four clock; and
an output timing signal generating unit that generates the output timing signal in response to the clock, an inverted clock, and the output enable signal.

9. The data output circuit of claim 8,
wherein the input control signal generating unit inverts the level of the output enable signal to be first enabled among the output enable signals at a timing when the divided-by-four clock is changed to a high level, and outputs the inverted level as the level of the input control signal.

10. The data output circuit of claim 8,
wherein the output timing signal generating unit outputs the clock or the inverted clock as the output timing signal during an enable period of a prescribed output enable signal among the output enable signals.

11. The data output circuit of claim 10,
wherein the output timing signal generating unit includes:
a plurality of signal combine units that receive the clock or the inverted clock and the prescribed output enable signal, and generate the output timing signal.

12. The data output circuit of claim 1,
wherein the signal-responsive data output unit includes:
a data selection unit that outputs prescribed data of the parallel data as selected data in response to the input control signal and the selection signal; and
a data output unit that outputs the selected data as serial data in response to the output timing signal.

13. The data output circuit of claim 12,
wherein the data selection unit receives the parallel data in response to the input control signal and outputs the selected data in response to the selection signal.

14. The data output circuit of claim 12,
wherein the data output unit includes:
a plurality of output control units that output the selected data as the serial data in response to the output timing signal.

15. The data output circuit of claim 14,
wherein an output terminal of the data output unit is connected to a common node between the output terminals of the plurality of output control units.

16. A data output circuit for a semiconductor memory apparatus that determines an output sequence of first data and second data, the data output circuit comprising:
a data output control unit that generates a selection signal for determining the output sequence of the first and second data, and an output timing signal for determining an output timing of the first data or the second data, and
a signal-responsive data output unit that receives the first data and second data as parallel data, selects the first data during the enable period of the selection signal and outputs the first data in synchronization with the output timing signal, and selects the second data during the disable period of the selection signal and outputs the second data in synchronization with the output timing signal,
wherein the output timing signal is generated in correspondence with an enable period and a disable period of the selection signal.

17. The data output circuit of claim 16,
wherein the data output control unit includes:
an output enable signal generation unit that, when a read command is input, generates a plurality of output enable signals in synchronization with a clock;
a clock control unit that divides the clock to generate a divided-by-two clock and delays the divided-by-two clock to generate a plurality of delayed divided-by-two clocks; and
a data output control unit that generates the selection signal and the output timing signal in response to the plurality of output enable signals, the divided-by-two clock, and the plurality of delayed divided-by-two clocks.

18. The data output circuit of claim 17,
wherein, if a first enabled output enable signal among the plurality of output enable signals is disabled, the output enable signal generation unit causes a next output enable signal to be enabled.

19. The data output circuit of claim 18,
wherein the output enable signal generation unit includes:
a plurality of shift registers that start to operate in response to the read command and the clock, and
each of the shift registers outputs a single output enable signal.

20. The data output circuit of claim 19,
wherein the plurality of shift registers commonly receive the clock and are connected in series, and the first shift register starts to operate according to the read command.

21. The data output circuit of claim 17,
wherein the clock control unit includes:
a clock dividing unit that divides-by-two the clock to generate the divided-by-two clock; and
a delated clock generating unit that delays the divided-by-two clock to generate the plurality of delayed divided-by-two clocks.

22. The data output circuit of claim 17, wherein the data output control signal generation unit includes:

a selection signal generating unit that generates the selection signal in response to the output enable signal and the divided-by-two clock or the delayed divided-by-two clocks; and an output timing signal generating unit that generates the output timing signal in response to the clock and the output enable signal.

23. A data output circuit for a semiconductor memory apparatus that determines an output sequence of first data and second data, the data output circuit comprising:

a data output control unit that generates a selection signal for determining the output sequence of the first and second data, and an output timing signal for determining an output timing of the first data or the second data using the selection signal; and a signal-responsive data output unit that selects the first data during an enable period of the selection signal and outputs the first data in synchronization with the output timing signal, and selects the second data during a disable period of the selection signal and outputs the second data in synchronization with the output timing signal, wherein the data output control unit includes:

an output enable signal generation unit that, when a read command is input, generates a plurality of output enable signals in synchronization with a clock;

a clock control unit that divides-by-two the clock to generate a divided-by-two clock and delays the divided-by-two clock to generate a plurality of delayed divided-by-two clocks; and a data output control unit that generates the selection signal and the output timing signal in response to the plurality of output enable signals, the divided-by-two clock, and the plurality of delayed divided-by-two clocks.

24. The data output circuit of claim 23, wherein the data output control signal generation unit includes:

a selection signal generating unit that generates the selection signal in response to the output enable signal and the divided-by-two clock or the delayed divided-by-two clock; and an output timing signal generating unit that generates the output timing signal in response to the clock and the output enable signal, and during an enable period of a prescribed output enable signal among the plurality of output enable signals, the clock or an inverted clock is output as the output timing signal.

* * * * *